US010192843B1

(12) United States Patent
Pachamuthu et al.

(10) Patent No.: US 10,192,843 B1
(45) Date of Patent: Jan. 29, 2019

(54) METHODS OF MAKING SEMICONDUCTOR DEVICE MODULES WITH INCREASED YIELD

(71) Applicant: Micron Technology, Inc., Boise, ID (US)

(72) Inventors: Ashok Pachamuthu, Boise, ID (US); Chan H. Yoo, Boise, ID (US); Szu-Ying Ho, Irvine, CA (US); John F. Kaeding, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/660,442

(22) Filed: Jul. 26, 2017

(51) Int. Cl.
*H01L 23/34* (2006.01)
*H01L 21/00* (2006.01)
(Continued)

(52) U.S. Cl.
CPC ............ *H01L 24/20* (2013.01); *H01L 21/565* (2013.01); *H01L 21/568* (2013.01); *H01L 21/6835* (2013.01); *H01L 21/76802* (2013.01); *H01L 21/76877* (2013.01); *H01L 23/3135* (2013.01); *H01L 24/05* (2013.01); *H01L 24/19* (2013.01); *H01L 24/96* (2013.01); *H01L 25/0657* (2013.01); *H01L 25/50* (2013.01);
(Continued)

(58) Field of Classification Search
CPC ..... H01L 24/20; H01L 25/50; H01L 25/0657; H01L 21/565; H01L 21/568; H01L 21/6835; H01L 21/76802; H01L 21/76877; H01L 23/3135; H01L 24/05; H01L 24/19; H01L 24/96
See application file for complete search history.

(56) References Cited

U.S. PATENT DOCUMENTS 6,507,115 B1 1/2003 Hofstee et al.
6,919,631 B1 7/2005 Hoffman et al.
(Continued)

FOREIGN PATENT DOCUMENTS

KR 10-2015-0081161 A 7/2015

OTHER PUBLICATIONS

International Written Opinion from International Application No. PCT/US2018/042140, dated Oct. 29, 2018, 8 pages.
(Continued)

*Primary Examiner* — Alonzo Chambliss
(74) *Attorney, Agent, or Firm* — TraskBritt

(57) ABSTRACT

Methods of making semiconductor device modules may involve forming holes in a sacrificial material and placing an electrically conductive material in the holes. The sacrificial material may be removed to expose posts of the electrically conductive material. A stack of semiconductor dice may be placed between at least two of the posts after removing the sacrificial material, one of the semiconductor dice of the stack including an active surface facing in a direction opposite a direction in which another active surface of another of the semiconductor dice of the stack. The posts and the stack of semiconductor dice may be at least laterally encapsulated in an encapsulant. Bond pads of the one of the semiconductor dice may be electrically connected to corresponding posts after at least laterally encapsulating the posts and the stack of semiconductor dice.

20 Claims, 16 Drawing Sheets

(51) Int. Cl.
*H01L 23/00* (2006.01)
*H01L 21/768* (2006.01)
*H01L 25/00* (2006.01)
*H01L 21/56* (2006.01)
*H01L 21/683* (2006.01)
*H01L 25/065* (2006.01)
*H01L 23/31* (2006.01)

(52) U.S. Cl.
CPC ............... *H01L 2221/68359* (2013.01); *H01L 2221/68381* (2013.01); *H01L 2224/211* (2013.01); *H01L 2225/06527* (2013.01); *H01L 2225/06548* (2013.01); *H01L 2225/06586* (2013.01); *H01L 2924/3511* (2013.01); *H01L 2924/37001* (2013.01)

(56) References Cited

U.S. PATENT DOCUMENTS

| | | | |
|---|---|---|---|
| 7,538,033 B2 | 5/2009 | Trezza | |
| 7,807,512 B2* | 10/2010 | Lee | H01L 21/6835 438/107 |
| 8,669,140 B1 | 3/2014 | Kesvakumar et al. | |
| 8,754,514 B2 | 6/2014 | Yu et al. | |
| 9,437,580 B1 | 9/2016 | No et al. | |
| 9,543,274 B2 | 1/2017 | Groothuis et al. | |
| 2004/0032013 A1 | 2/2004 | Chad et al. | |
| 2006/0197181 A1 | 9/2006 | Noguchi | |
| 2006/0278992 A1 | 12/2006 | Trezza et al. | |
| 2007/0089773 A1 | 4/2007 | Koester et al. | |
| 2008/0093733 A1 | 4/2008 | Hsu | |
| 2009/0239336 A1* | 9/2009 | Lee | H01L 21/6835 438/107 |
| 2011/0045634 A1 | 2/2011 | Reza | |
| 2011/0176280 A1 | 7/2011 | Lee | |
| 2011/0278638 A1 | 11/2011 | Lin et al. | |
| 2016/0099213 A1* | 4/2016 | Tae | H01L 23/5389 257/777 |

OTHER PUBLICATIONS

International Search Report from International Application No. PCT/US2018/042140, dated Oct. 29, 2018, 4 pages.

* cited by examiner

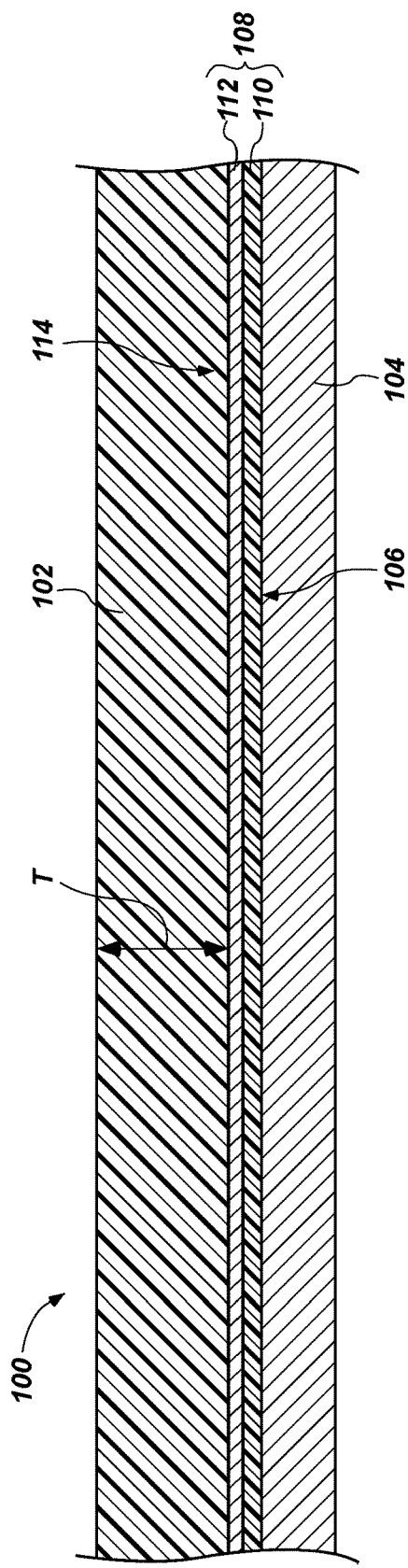
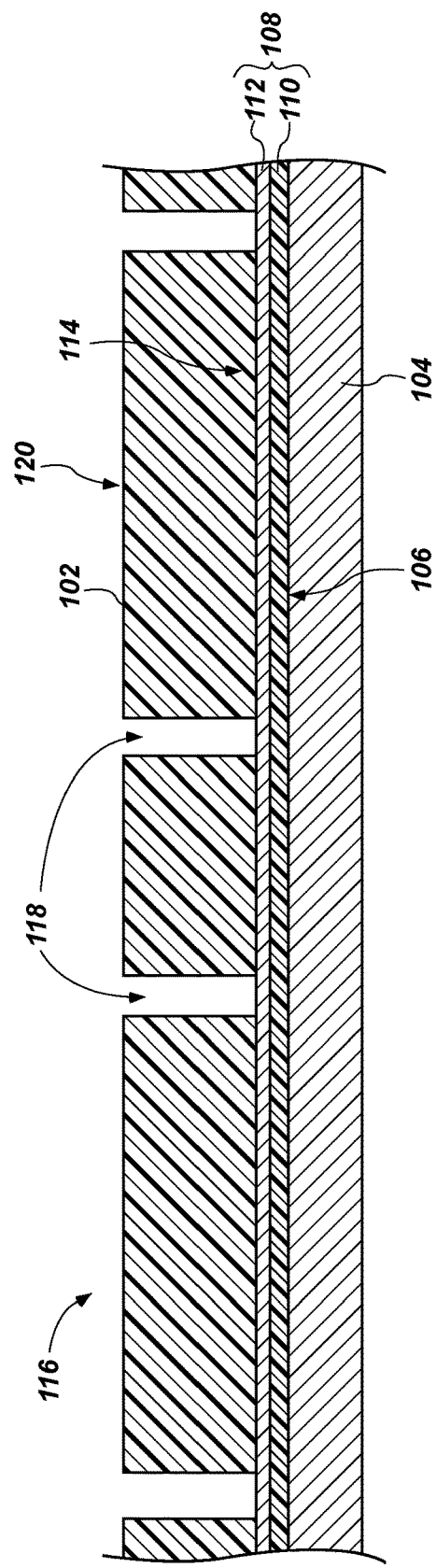
FIG. 1
FIG. 2

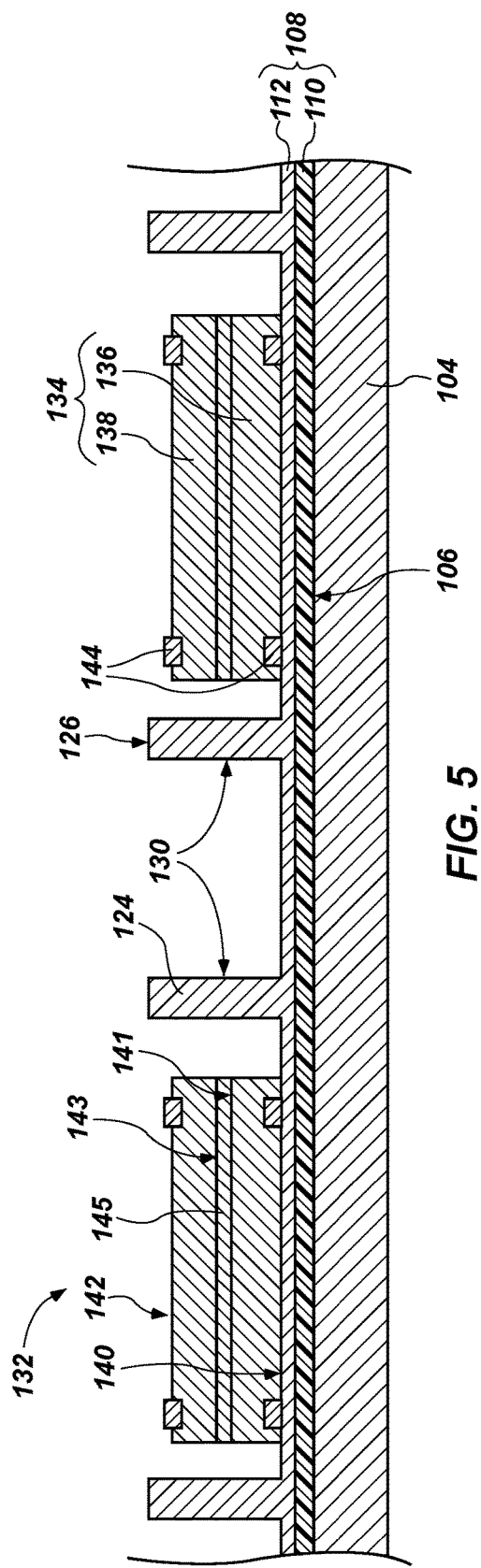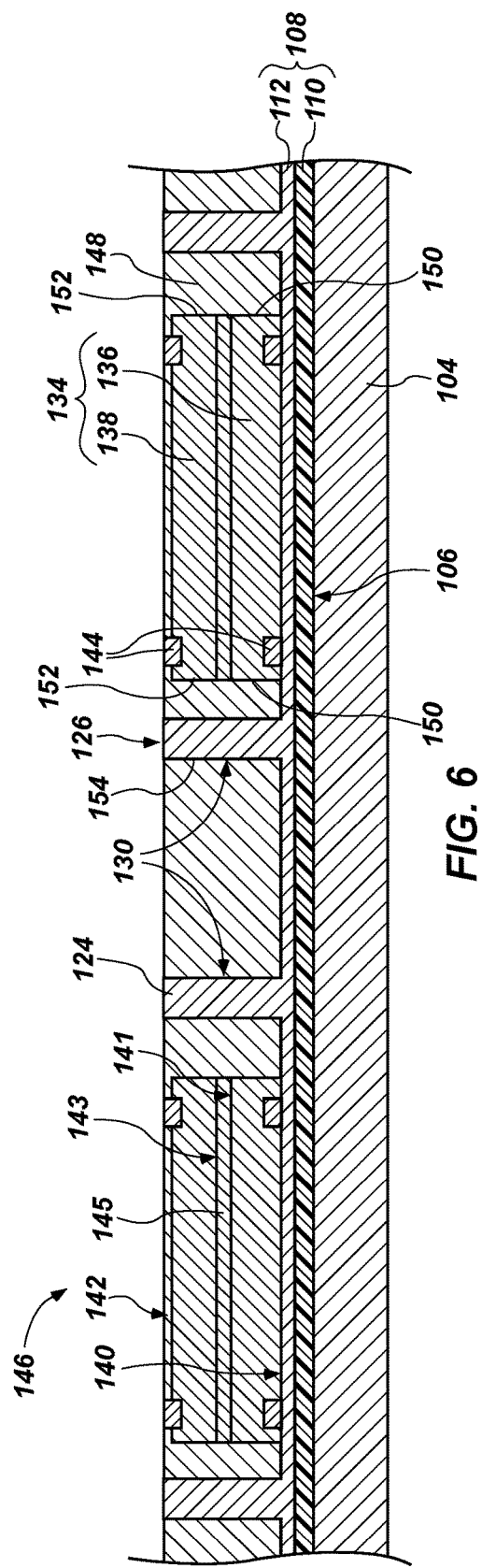

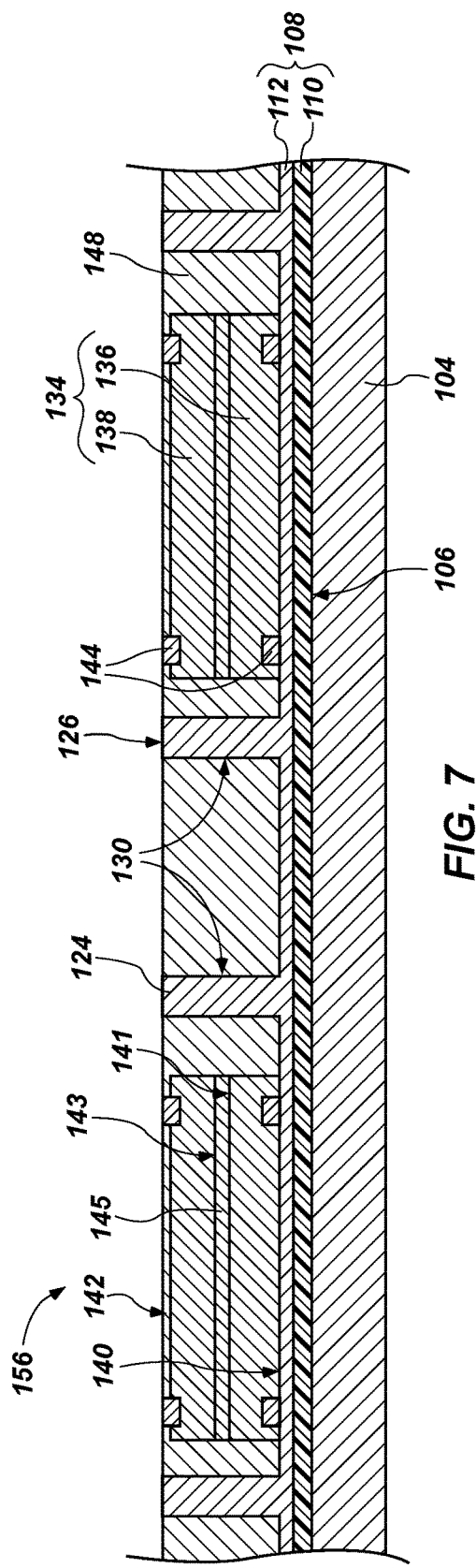
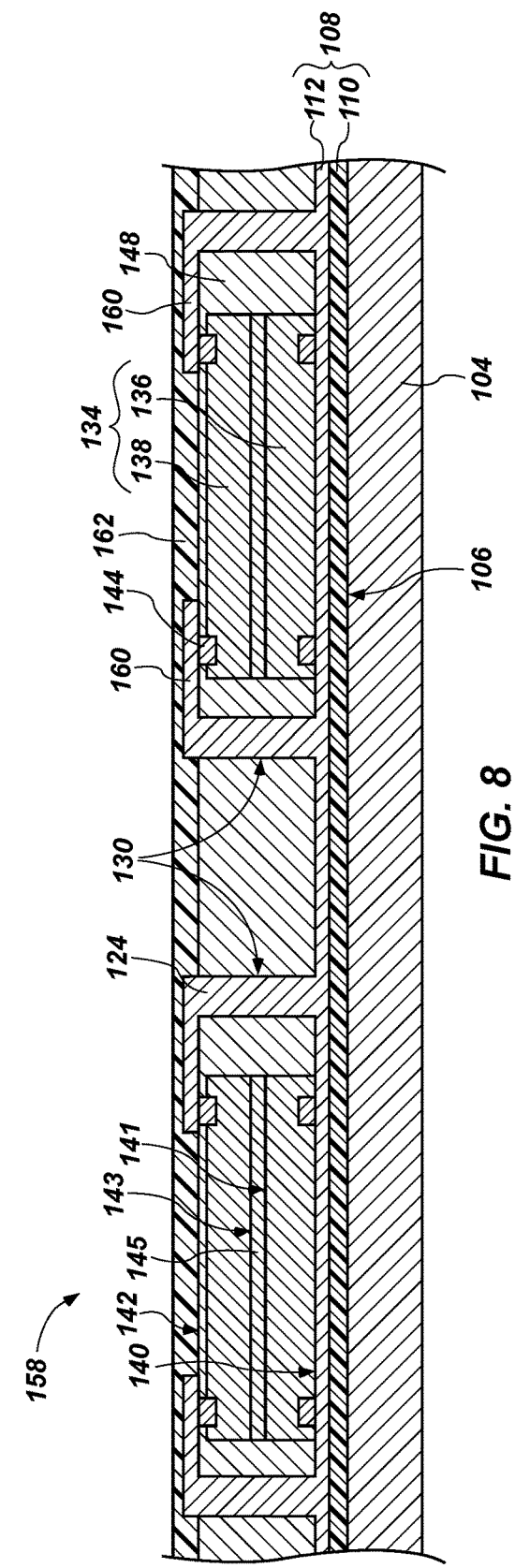

METHODS OF MAKING SEMICONDUCTOR DEVICE MODULES WITH INCREASED YIELD

FIELD

This disclosure relates generally to semiconductor device modules and methods of making semiconductor device modules. More specifically, disclosed embodiments relate to methods of making semiconductor device modules that may increase yield, reduce warpage, and improve reliability.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 1 is a cross-sectional side view of a first intermediate product in a first stage of a process of making a semiconductor device module;

FIG. 2 is a cross-sectional side view of a second intermediate product in a second stage of the process of making the semiconductor device module;

FIG. 5 is a cross-sectional side view of a fifth intermediate product in a fifth stage of the process of making the semiconductor device module;

FIG. 6 is a cross-sectional side view of a sixth intermediate product in a sixth stage of the process of making the semiconductor device module;

FIG. 7 is a cross-sectional side view of a seventh intermediate product in a seventh stage of the process of making the semiconductor device module;

FIG. 8 is a cross-sectional side view of an eighth intermediate product in an eighth stage of the process of making the semiconductor device module;

DETAILED DESCRIPTION

Figure 3:
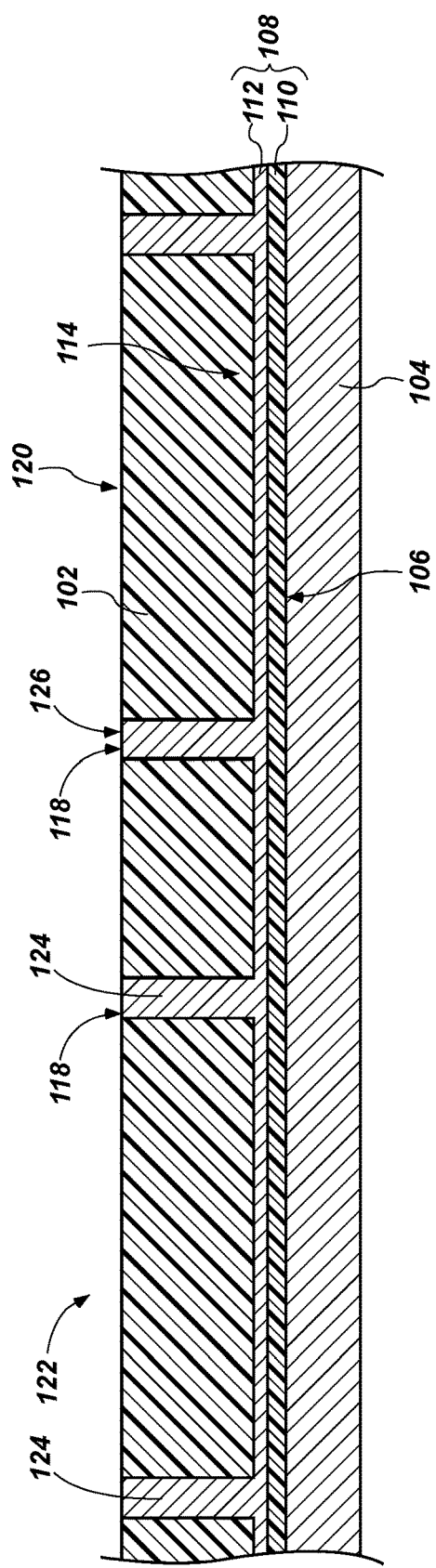
FIG. 3 is a cross-sectional side view of a third intermediate product in a third stage of the process of making the semiconductor device module.

The illustrations presented in this disclosure are not meant to be actual views of any particular semiconductor device, semiconductor device module, component thereof, or act in a process of making a semiconductor device module, but are merely idealized representations employed to describe illustrative embodiments. Thus, the drawings are not necessarily to scale.

Disclosed embodiments relate generally to methods of making semiconductor device modules that may increase yield, reduce warpage, and improve module reliability. More specifically, disclosed are embodiments of methods of making semiconductor device modules that may involve the formation of electrically conductive posts that are subsequently exposed and connected to a semiconductor device.

Referring to FIG. 1, a cross-sectional side view of a first intermediate product 100 in a first stage of a process of making a semiconductor device module is shown. The first intermediate product 100 may be formed by temporarily securing a sacrificial material 102 to a support substrate 104. The sacrificial material 102 may be, for example, of an at least substantially uniform thickness T as measured in a direction perpendicular to an upper surface 106 of the support substrate 104 to which the sacrificial material 102 is temporarily secured. The sacrificial material 102 may include, for example, a dielectric material. More specifically, the sacrificial material 102 may include a photoresist material. As a specific, nonlimiting example, the sacrificial material 102 may comprise a photosensitive material including, for example, diazonaphthoquinone and a phenol formaldehyde resin (e.g., novolac resin).

The support substrate 104 may be sized and shaped to structurally reinforce the sacrificial material 102. The support substrate 104 may include, for example, a material with sufficient rigidity to support the overlying sacrificial material 102. More specifically, the support substrate 104 may include, for example, a semiconductor material or a ceramic material. As a specific, nonlimiting example, the support substrate 104 may include a glass material.

The sacrificial material 102 may be secured to the support substrate 104 by a temporary bonding material 108. The temporary bonding material 108 may include at least a first material 110 configured to temporarily secure the sacrificial material 102 to the support substrate 104. The first material 110 may include, for example, a polymeric material. More specifically, the first material 110 may include, for example, an adhesive material. As a specific, nonlimiting example, the first material 110 may include, for example, an ultraviolet-light-curable or a heat-curable adhesive material. The first material 110 of the temporary bonding material 108 may be interposed between the sacrificial material 102 and the support substrate 104. For example, the first material 110 may be in direct contact with the upper surface 106 of the support substrate 104 facing the sacrificial material 102.

In some embodiments, such as that shown in FIG. 1, the temporary bonding material 108 may further include a second material 112 configured to temporarily secure another structure of electrically conductive material to be formed during the process of forming a semiconductor device module. The second material 112 may include, for example, a material configured to bond with an electrically conductive material. More specifically, the second material 112 may include, for example, an oxide, an inorganic material, a metal or metal alloy material. As specific, nonlimiting examples, the second material 112 may include silicon oxide, a carbide, aluminum, an aluminum alloy, copper, a copper alloy, gold, a gold alloy, silver, a silver alloy, tin, or a tin alloy. The second material 112 may be in direct contact with a lower surface 114 of the sacrificial material 102 facing the support substrate 104. For example, the second material 112 may be interposed between the first material 110 and the sacrificial material 102 as shown in FIG. 1, or may be intermixed throughout the first material 110.

The intermediate product 100 may be formed by, for example, placing the temporary bonding material 108 on the upper surface 106 of the support substrate 104 and forming the sacrificial material 102 on the preformed and already-placed temporary bonding material 108. As another example, the intermediate product 100 may be formed by forming the temporary bonding material 108 on the upper surface 106 of the support substrate 104 and placing the lower surface 114 of a preformed mass of the sacrificial material 102 in contact with the temporary bonding material 108.

The intermediate product 100 may be scalable. For example, the intermediate product 100 may initiate a process for forming a single semiconductor device module, multiple semiconductor device modules in a line, or multiple semiconductor device modules in an array.

FIG. 2 is a cross-sectional side view of a second intermediate product 116 in a second stage of the process of making the semiconductor device module. During the second stage, holes 118 may be formed in the sacrificial material 102. The holes 118 may extend from an upper surface 120 of the sacrificial material 102, through the sacrificial material 102, to at least the lower surface 114 of the sacrificial material 102. The holes 118 may be positioned in predetermined locations, for example, in a predetermined pattern.

A height H of each hole 118 may be, for example, between about 10 microns and about 200 microns. More specifically, the height H of each hole 118 may be, for example, between about 50 microns and about 200 microns. As a specific, nonlimiting example, the height H of each hole 118 may be, for example, between about 100 microns and about 200 microns (e.g., about 150 microns). A width W of each hole 118 may be, for example, between about 10 microns and about 90 microns. More specifically, the width W of each hole 118 may be, for example, between about 20 microns and about 50 microns.

The holes 118 may be formed by, for example, applying a mask to the upper surface 120 of the sacrificial material 102 and removing material from exposed portions of the sacrificial material 102 not covered by the mask by exposure to light of a predetermined wavelength (e.g., ultraviolet light) or by etching. As additional examples, the holes 118 may be formed by drilling (e.g., laser drilling) or via exposure to a solvent.

FIG. 3 is a cross-sectional side view of a third intermediate product 122 in a third stage of the process of making the semiconductor device module. During the third stage, an electrically conductive material 124, such as, for example, copper, may be placed in the holes 118. For example, the electrically conductive material 124 may fill the holes 118, such that the electrically conductive material 124 may contact the temporary bonding material 108 and an upper surface 126 of the electrically conductive material 124 may be at least substantially flush with the upper surface 120 of the sacrificial material 102.

In embodiments in which the temporary bonding material 108 includes the second material 112, the electrically conductive material 124 may contact and be temporarily secured to at least the second material 112 of the temporary bonding material 108. For example, the electrically conductive material 124 may bond with the second material 112.

The electrically conductive material 124 may be positioned in the holes 118 by, for example, electroplating, electroless plating, sputtering, or other process. Positioning the electrically conductive material 124 in the holes 118 may occur before any electrical connections intended to be present in the semiconductor device module have been formed, which may reduce the likelihood that that conditions under which the electrically conductive material 124 is positioned in the holes 118 would weaken, damage, or disconnect such connections. As a result, a greater quantity of the resulting semiconductor device modules may be operational, increasing yield.

Figure 4:
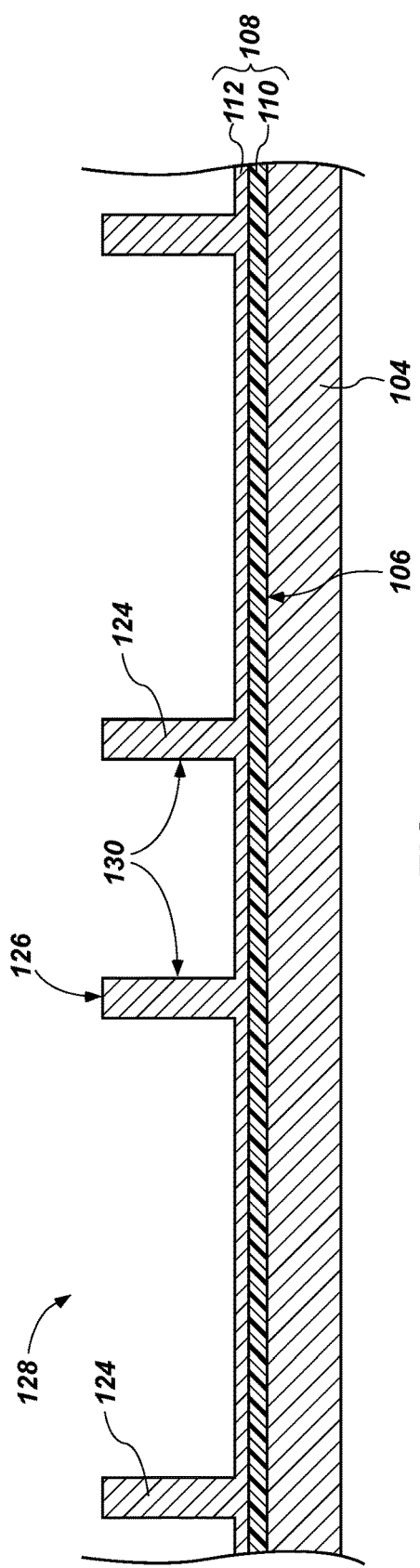
FIG. 4 is a cross-sectional side view of a fourth intermediate product in a fourth stage of the process of making the semiconductor device module.

FIG. 4 is a cross-sectional side view of a fourth intermediate product 128 in a fourth stage of the process of making the semiconductor device module. During the fourth stage, the sacrificial material 102 may be removed, exposing posts 130 of the electrically conductive material 124. The sacrificial material 102 may be removed by, for example, stripping, exposing the sacrificial material 102 to a solvent, exposing the sacrificial material 102 to light of a predetermined wavelength (e.g., ultraviolet light), or exposing the sacrificial material 102 to heat. The remaining posts 130 may be held in place by the temporary bonding material 108.

FIG. 5 is a cross-sectional side view of a fifth intermediate product 132 in a fifth stage of the process of making the semiconductor device module. During the fifth stage, a stack 134 of semiconductor dice 136 and 138 may be placed between at least two of the posts 130. For example, a stack 134 of semiconductor dice 136 and 138 may be placed between each of two respective sets of posts 130. As shown in FIG. 5, a given semiconductor device module may include multiple stacks 134 of semiconductor dice 136 and 138. For example, each semiconductor device module may ultimately include, two, four, six, or eight stacks 134 of semiconductor dice 136 and 138.

Each stack 134 may include at least two semiconductor dice 136 and 138. For example, each stack 134 may include a first semiconductor die 136 located proximate the support substrate 104 and a second semiconductor die 138 located on a side of the first semiconductor die 136 opposite the support substrate 104. A first active surface 140 of the first semiconductor die 136 may face the support substrate 104, and be in contact with the temporary bonding material 108. A second active surface 142 of the second semiconductor die 138 may face in a direction opposite the direction in which the first active surface 140 faces. For example, the second active surface 142 of the second semiconductor die 138 may be located on a side of the second semiconductor die 138 opposite the first semiconductor die 136. The first semiconductor die 136 may be secured to the second semiconductor die 138 by a bonding material 145 located between the first semiconductor die 136 and the second semiconductor die 138. More specifically, the bonding material 145 may be, for example, located between, and in direct contact with, a first inactive surface 141 of the first semiconductor die 136 and a second inactive surface 143 of the second semiconductor die 138. Each of the first active surface 140 and the second active surface 142 may include bond pads 144 configured to form electrical and operative connections. The first active surface 140 of the first semiconductor die 136 and the second active surface 142 of the second semiconductor die 138 may include integrated circuitry embedded therein, the integrated circuitry being electrically and operatively connected to the bond pads 144. For example, the first semiconductor die 136, the second semiconductor die 138, or both the first semiconductor die 136 and the second semiconductor die 138 may be configured as a logic chip or a memory chip.

Placement of the stacks 134 of semiconductor dice 136 and 138 may be performed using, for example, a pick-and-place operation as is known in the art.

FIG. 6 is a cross-sectional side view of a sixth intermediate product 146 in a sixth stage of the process of making the semiconductor device module. During the sixth stage, the posts 130 and the stacks 134 of semiconductor dice 136 and 138 may be at least laterally encapsulated by, for example, overmolding, in an encapsulant 148. For example, the encapsulant 148 may completely cover at least the first side surfaces 150 of the first semiconductor die 136, the second side surfaces 152 of the second semiconductor die 138, and the side surface 154 of each post 130. In some embodiments, the encapsulant 148 may further extend over the second active surface 142 of the second semiconductor die 138, the upper surface 126 of one or more posts 130, or both. The encapsulant 148 may include, for example, a dielectric material. More specifically, the encapsulant 148 may include a cured polymer material. The encapsulant 148 may structurally support the stacks 134 of semiconductor dice 136 and 138 and the posts 130, as well as securing them in place.

FIG. 7 is a cross-sectional side view of a seventh intermediate product 156 in a seventh stage of the process of making the semiconductor device module. During the seventh stage, material of at least the encapsulant 148 may be removed to render the encapsulant 148 flush with the bond pads 144 of each second semiconductor die 138 and with the upper surface 126 of each post 130. For example, material of the encapsulant 148 may be removed in a direction at least substantially perpendicular to the second active surface 142 of the second semiconductor die 138. In some embodiments, electrically conductive material 124 of one or more of the posts 130 may be removed during the seventh stage to render the upper surface 126 of each post 130 flush with the bond pads 144 of the second semiconductor dice 138. In some embodiments, material of one or more of the bond pads 144 may be removed during the seventh stage to render the bond pads 144 flush with the upper surfaces 126 of the posts 130 and the encapsulant 148. For example, material of the bond pads 144 may initially protrude from the second active surface 142 of the second semiconductor die 138, and removal may render them closer to, or flush with, the second active surface 142. Removal may be accomplished by, for example, grinding away the relevant material.

FIG. 8 is a cross-sectional side view of an eighth intermediate product 158 in an eighth stage of the process of making the semiconductor device module. During the eighth stage, the bond pads 144 of each second semiconductor die 138 may be electrically connected to corresponding posts 130. For example, electrical connectors 160 may be formed, each extending from its corresponding post 130, over an intervening portion of the encapsulant 148, to a respective bond pad 144. The electrical connectors 160 may be formed by, for example, placing or forming conductive traces extending from the posts 130 to their respective bond pads 144. The electrical connectors 160 may include, for example, a metal or metal alloy material.

Electrically connecting the second semiconductor die 138 via the posts 130 and electrical connectors 160 may be less costly and more reliable than conventional methods of electrically connecting similarly configured semiconductor dice to underlying structures. For example, each of forming through-silicon vias and forming wire bonds takes more time and expends more resources without producing a significantly lower failure rate than the methods disclosed herein. As a result, the disclosed methods may save time and resources while maintaining or improving the reliability of electrical connections, increasing yield.

In some embodiments, a dielectric protective material 162, which may also be characterized as a passivation material, may be placed over at least the electrical connectors 160. For example, the protective material 162 may extend from a location located over the encapsulant 148 located laterally adjacent to a post 130 at a periphery of what will eventually form a given semiconductor device module, over the post 130 and its associated electrical connector 160, over the second active surface 142 of the second semiconductor die 138, over another electrical connector 160 and associated post 130, to at least another portion of the encapsulant 148 located laterally adjacent to the other post 130. More specifically, the protective material 162 may extend from a location located over the encapsulant 148 located laterally adjacent to a post 130 at a periphery of what will eventually form a given semiconductor device module, over the post 130 and its associated electrical connector 160, over each stack 134 of semiconductor dice 136 and 138 to be included in the semiconductor device module, over another electrical connector 160 and associated post 130 at an opposite periphery of what will eventually form the given semiconductor device module, to at least another portion of the encapsulant 148 located laterally adjacent to another post 130 on a side of what will eventually form the given semiconductor device module opposite where the protective material 162 started. The protective material 162 may include, for example, a polymer material.

Figure 9:
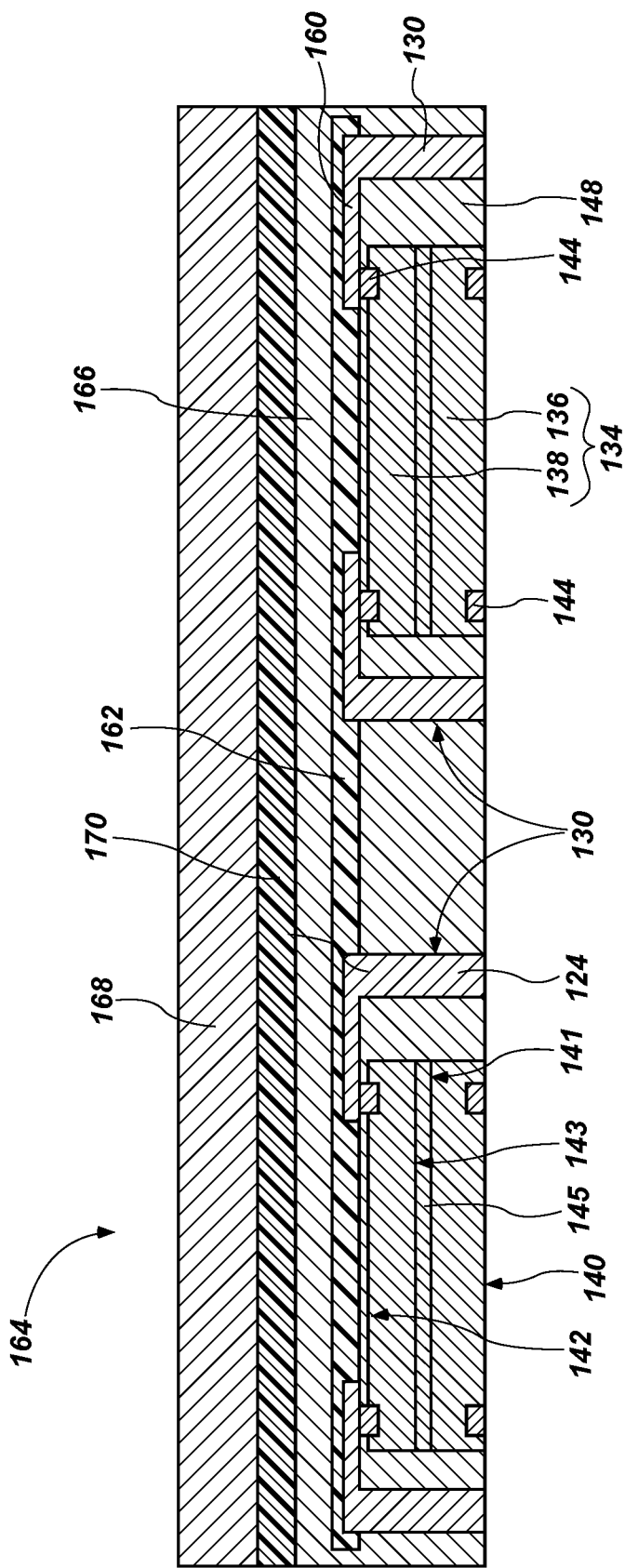
FIG. 9 is a cross-sectional side view of a ninth intermediate product in a ninth stage of the process of making the semiconductor device module.

FIG. 9 is a cross-sectional side view of a ninth intermediate product 164 in a ninth stage of the process of making the semiconductor device module. During the ninth stage, another encapsulant 166 may be positioned over the stacks 134 of semiconductor dice 136 and 138. For example, the other encapsulant 166 may be placed over an entire exposed upper portion of the eighth intermediate product 158 (see FIG. 8), such that the other encapsulant 166 may cover the first encapsulant 148, the posts 130 and associated electrical connectors 160, the bond pads 144 and stacks 134 of semiconductor dice 136 and 138, and the optional protective material 162. In embodiments including the protective material 162, the other encapsulant 166 may be in direct contact with the first encapsulant 148 and the protective material 162. In embodiments lacking the protective material 162, the other encapsulant 166 may be in direct contact with the first encapsulant 148, the electrical connectors 160 and, optionally, portions of any combination of the posts 130, bond pads 144, and second active surfaces 142 of the second semiconductor dice 138. The other encapsulant 166 may include, for example, a dielectric material. More specifically, the other encapsulant 166 may include, for example, a cured polymer material. The other encapsulant 166 may be the same material as, or a different material from, the first encapsulant 148.

After placing the other encapsulant 166, the ninth stage may further involve removing the support substrate 104 (see FIG. 8) from underneath the first active surfaces 140 of the first semiconductor dice 136. For example, the temporary bonding material 108 (see FIG. 8) may be weakened or removed, and the support substrate 104 (see FIG. 8) may be displaced to detach the support substrate 104 (see FIG. 8) from the first active surfaces 140 of the first semiconductor dice 136 and other remaining components. More specifically, the temporary bonding material 108 (see FIG. 8) may be weakened or removed by exposure to, for example, heat, light (e.g., ultraviolet light), or a solvent, and the support substrate 104 (see FIG. 8) may be displaced laterally to detach the support substrate 104 (see FIG. 8) from the first active surfaces 140 of the first semiconductor dice 136 and other remaining components.

In addition, the ninth stage may involve securing another support substrate 168 to the other encapsulant 166 on a side of the other encapsulant 166 opposite the stacks 134 of semiconductor dice 136 and 138. For example, another temporary bonding material 170 may be positioned over the other encapsulant 166 on a side of the other encapsulant 166 opposite the protective material 162, and the other support substrate 168 may be placed in contact with the other temporary bonding material 170 to secure the other support substrate 168 to the other encapsulant 166. The other support substrate 168 and the other temporary bonding material 170 may be selected from the materials described previously in connection with the first support substrate 104 and temporary bonding material 108, and may include the same materials as, or different materials from, the actual materials used for the first support substrate 104 and temporary bonding material 108. The assembly may then be inverted, supported by the other support substrate 168, for further processing.

Figure 10:
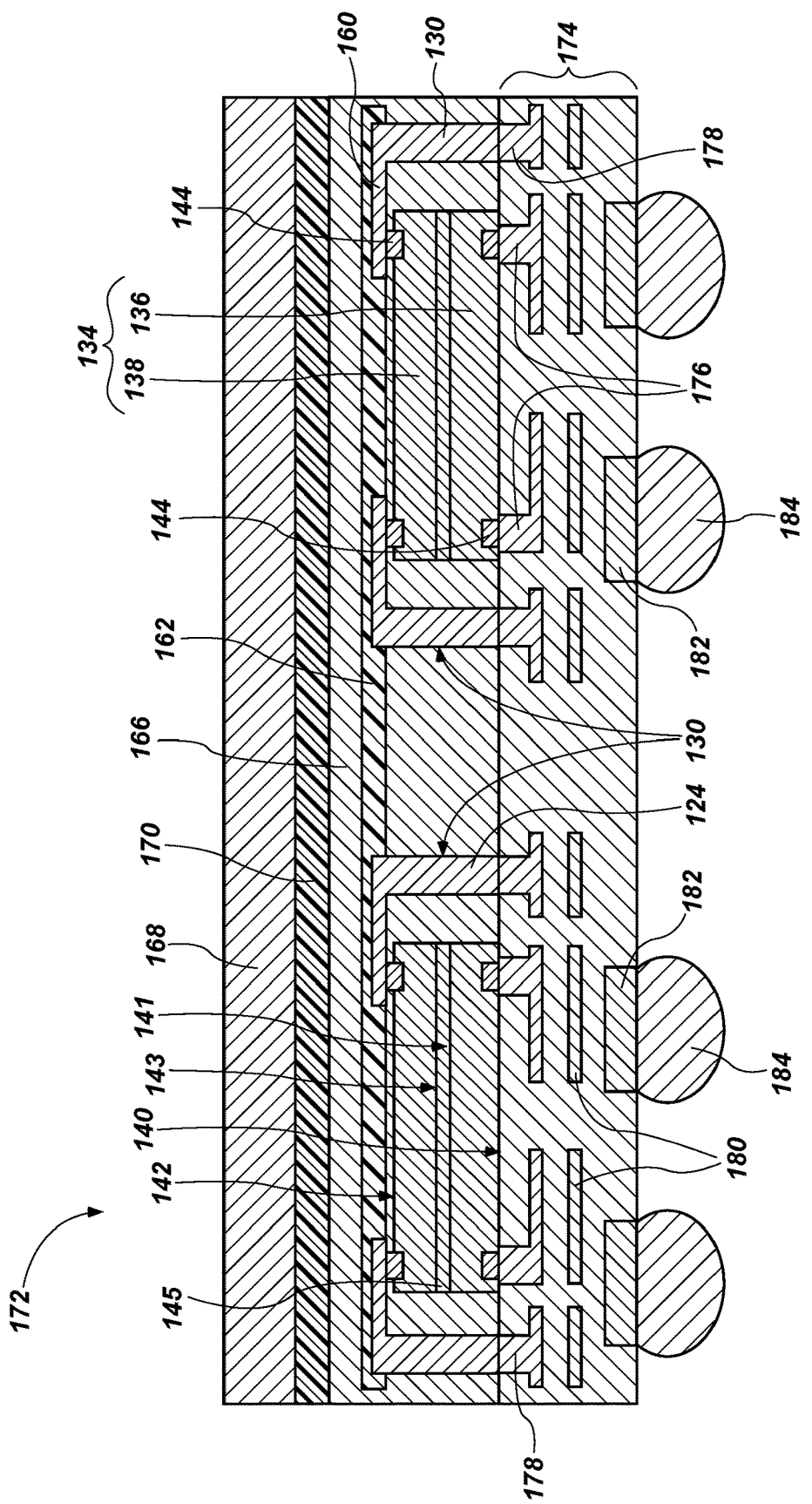
FIG. 10 is a cross-sectional side view of a tenth intermediate product in a tenth stage of the process of making the semiconductor device module.

FIG. 10 is a cross-sectional side view of a tenth intermediate product 172 in a tenth stage of the process of making the semiconductor device module. During the tenth stage, a redistribution layer 174 may be formed adjacent to the first active surface 140 of the first semiconductor dice 136. The redistribution layer 174 may be configured to route signals to and from the semiconductor dice 136 and 138 of the stacks 134. For example, the redistribution layer 174 may include contacts 176 in electrical communication with the bond pads 144 on the first active surfaces 140 of the first semiconductor dice 136 and other contacts 178 in electrical communication with the posts 130, which may place contacts 178 in electrical communication with the bond pads 144 on the second active surfaces 142 of the second semiconductor dice 138 by way of the electrical connectors 160. Routing connectors 180 may extend from the contacts 176 and 178 to bond pads 182 located on a side of the redistribution layer 174 opposite the stacks 134 of semiconductor dice 136 and 138 for output. The redistribution layer 174 may be formed by the selective, sequential placement of masses of electrically conductive material and dielectric material on the inverted assembly of FIG. 9, or by the addition of a preformed redistribution layer 174, as known in the art.

Also during the tenth stage, bumps 184 of electrically conductive material may be placed on the bond pads 182 to enable the stacks 134 of semiconductor dice 136 and 138 to be operatively connected to another device or structure, for example higher-level packaging. For example, the bumps 184 may be configured as balls, posts, pillars, columns, studs, slugs, or other masses of electrically conductive material secured to the bond pads 182. As a specific, nonlimiting example, the bumps 184 may comprise a ball grid array of solder balls.

Figure 11:
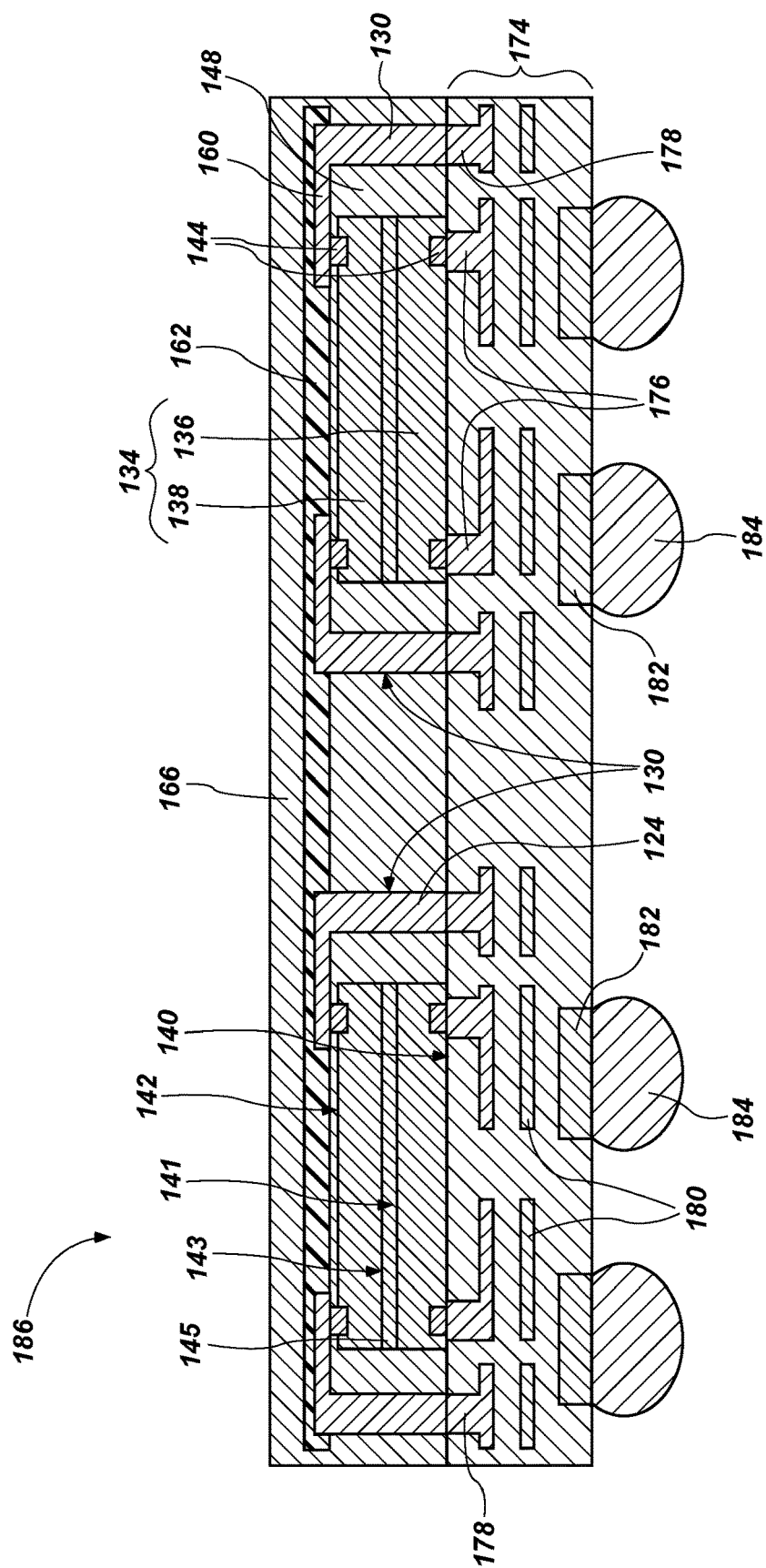
FIG. 11 is a cross-sectional side view of the semiconductor device module formed by the process of FIGS. 1 through 10.

FIG. 11 is a cross-sectional side view of the semiconductor device module 186 formed by the process of FIGS. 1 through 10. As a final act in stage ten, the other support substrate 168 (see FIG. 10) may be removed by performing any of the actions described previously in connection with removal of the first support substrate 104 (see FIG. 8) as applied to the other support substrate 168 and its associated other temporary bonding material 170.

The resulting semiconductor device module 186 may include a redistribution layer 174 including bond pads 182 electrically connected to bumps 184 of electrically conductive material on a first side of the redistribution layer 174 and contacts 176 and 178 of electrically conductive material on a second, opposite side of the redistribution layer. Bumps 184 of electrically conductive material may be secured to the bond pads 182. A first set of the contacts 176 may be secured to bond pads 144 of a first semiconductor die 136 of each stack 134 of semiconductor dice 136 and 138 in the semiconductor device module 186. A second set of the contacts 178 may be secured to posts 130 extending at least partially through an encapsulant 148 laterally surrounding the stacks 134 of semiconductor dice 136 and 138, the posts 130 extending in a direction at least substantially perpendicular to a first active surface 140 of the first semiconductor die 136. Respective posts 130 may be electrically connected to bond pads 144 of a second semiconductor die 138 of the stack 134 via electrical connectors 160 extending laterally over the encapsulant 148. A second active surface 142 of the second semiconductor die 138 may face in a direction opposite a direction in which the first active surface 140 faces. The electrical connectors 160 may be covered by a protective material 162, which may, in turn, be covered by another encapsulant 166. The semiconductor device module 186 may be operatively connected to another device by contacting the bumps 184 to corresponding bond pads and reflowing the bumps 184 to form an electrical connection.

Figure 12:
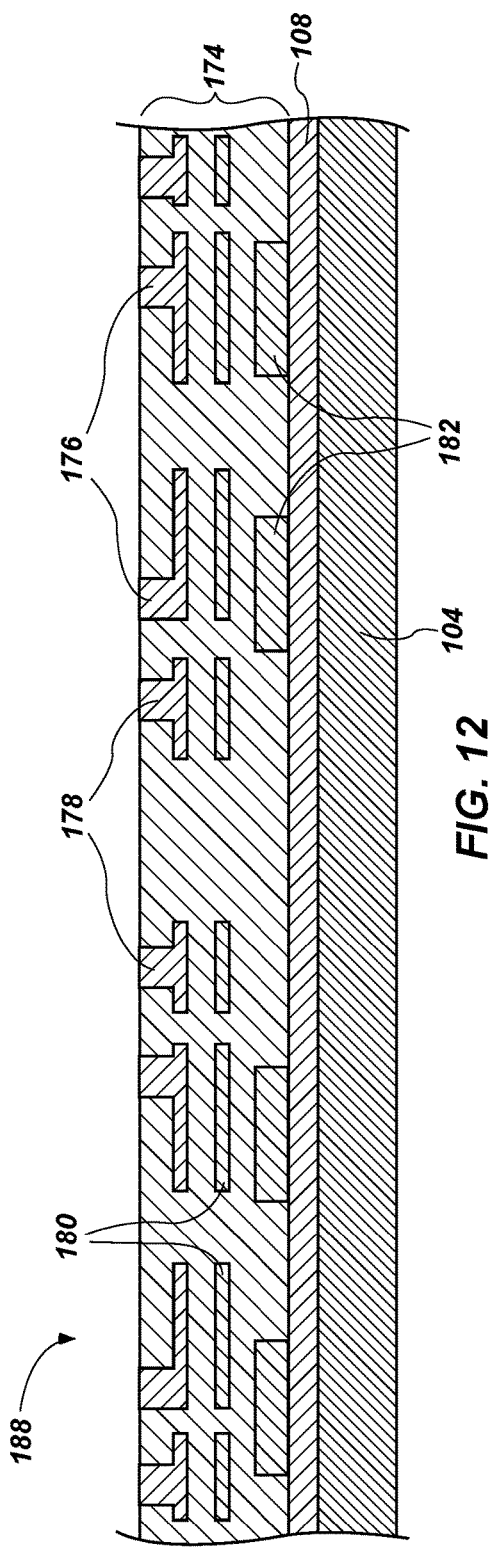
FIG. 12 is a cross-sectional side view of a first intermediate product in a first stage of another embodiment of a process of making a semiconductor device module as depicted in FIG. 11.

FIG. 12 is a cross-sectional side view of a first intermediate product 188 in a first stage of another embodiment of the process of making the semiconductor device module 186 (see FIG. 11). In this embodiment, the stacks 134 of semiconductor dice 136 and 138 may be added after introducing the redistribution layer 174, rather than introducing the redistribution layer 174 after placing the stacks 134 of semiconductor dice 136 and 138, as shown in FIGS. 5 through 10. During the first stage, the redistribution layer 174 may be secured to the support substrate 104. For example, a preformed redistribution layer 174 may be placed in contact with the temporary bonding material 108 on the support substrate 104, or the redistribution layer 174 may be formed on the bonding material 108 by the selective, sequential positioning of electrically conductive (by application and patterning of metal layers) and dielectric materials (by application and patterning to form apertures) on the bonding material 108 over the support substrate 104. The redistribution layer 174 may include bond pads 182 in predetermined locations on a first side of the redistribution layer 174 facing the support substrate 104 and contacts 176 and 178 in predetermined locations on a second, opposite side of the redistribution layer 174. Routing connectors 180 may extend between, and electrically connect, the contacts 176 and 178 to the bond pads 182.

Figure 13:
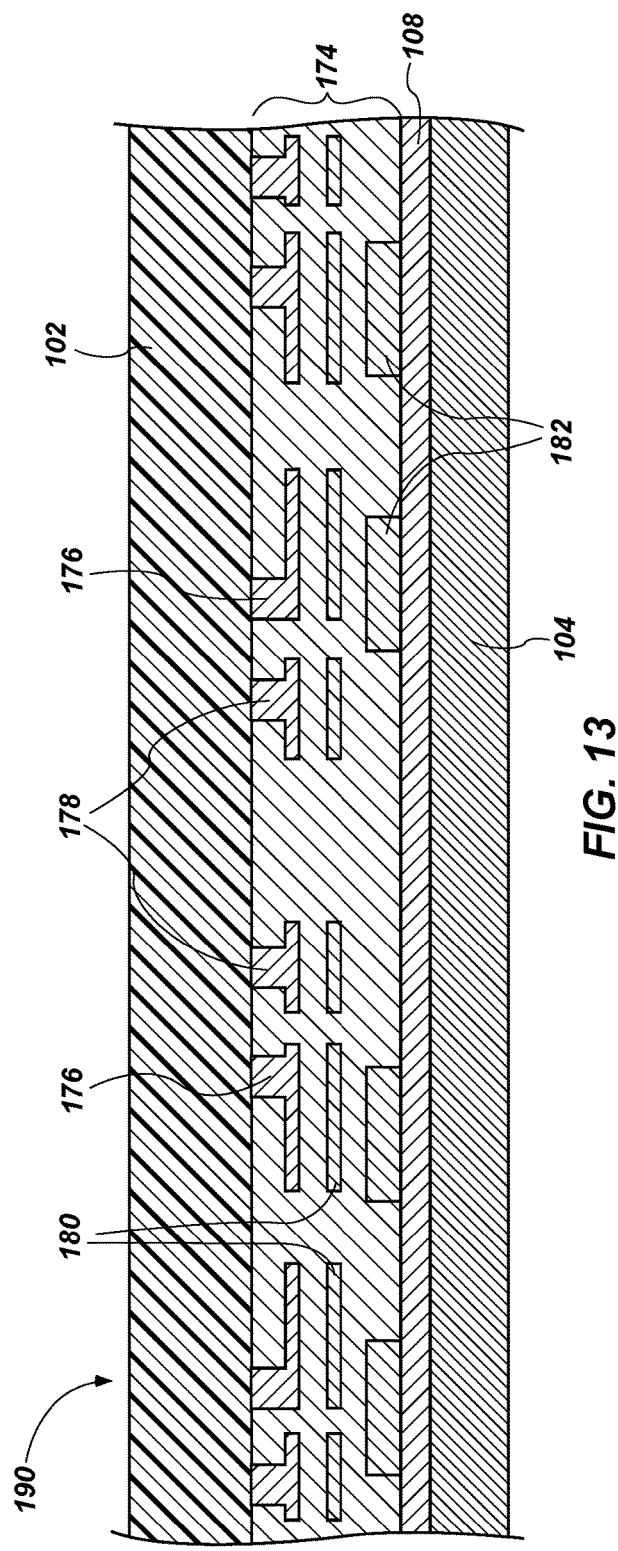
FIG. 13 is a cross-sectional side view of a second intermediate product in a second stage of the other embodiment of the process of making the semiconductor device module.

FIG. 13 is a cross-sectional side view of a second intermediate product 190 in a second stage of the other embodiment of the process of making the semiconductor device module 186 (see FIG. 11). During the second stage, the sacrificial material 102 may be positioned on the redistribution layer 174 on a side of the redistribution layer 174 opposite the support substrate 104, which may be accomplished by performing the acts described previously in connection with FIG. 1, as applied to the redistribution layer 174 shown in FIG. 13. For example, the sacrificial material 102 may cover the upper surface of the redistribution layer 174, and be in direct contact with the contacts 176 and 178.

Figure 14:
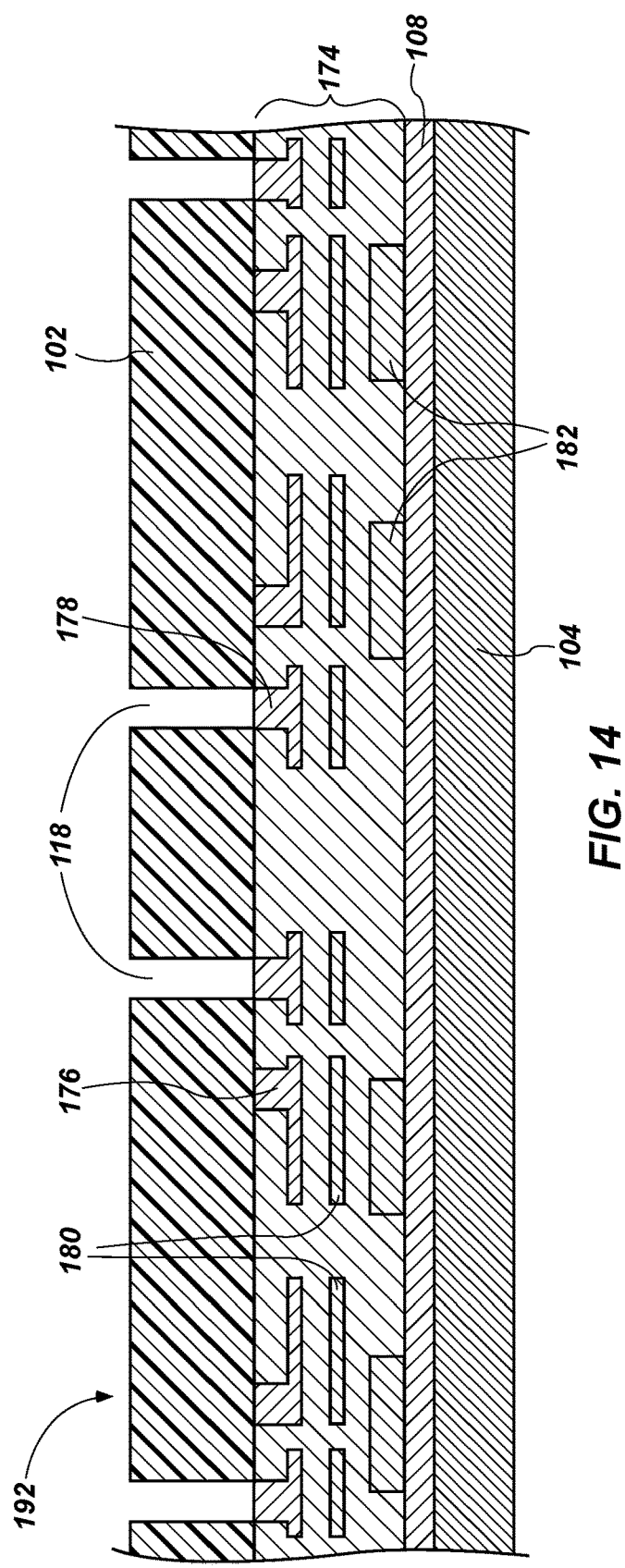
FIG. 14 is a cross-sectional side view of a third intermediate product in a third stage of the other embodiment of the process of making the semiconductor device module.

FIG. 14 is a cross-sectional side view of a third intermediate product 192 in a third stage of the other embodiment of the process of making the semiconductor device module 186 (see FIG. 11). During the third stage, the holes 118 may be formed in the sacrificial material 102. The holes 118 may be aligned with the contacts 178 configured for connection to the second semiconductor dice 138 (see FIG. 11), such that formation of the holes 118 may expose the contacts 178. Formation of the holes 118 may be accomplished by performing any of the actions described previously in connection with FIG. 2, as applied to the positioning and configuration shown in FIG. 14.

Figure 15:
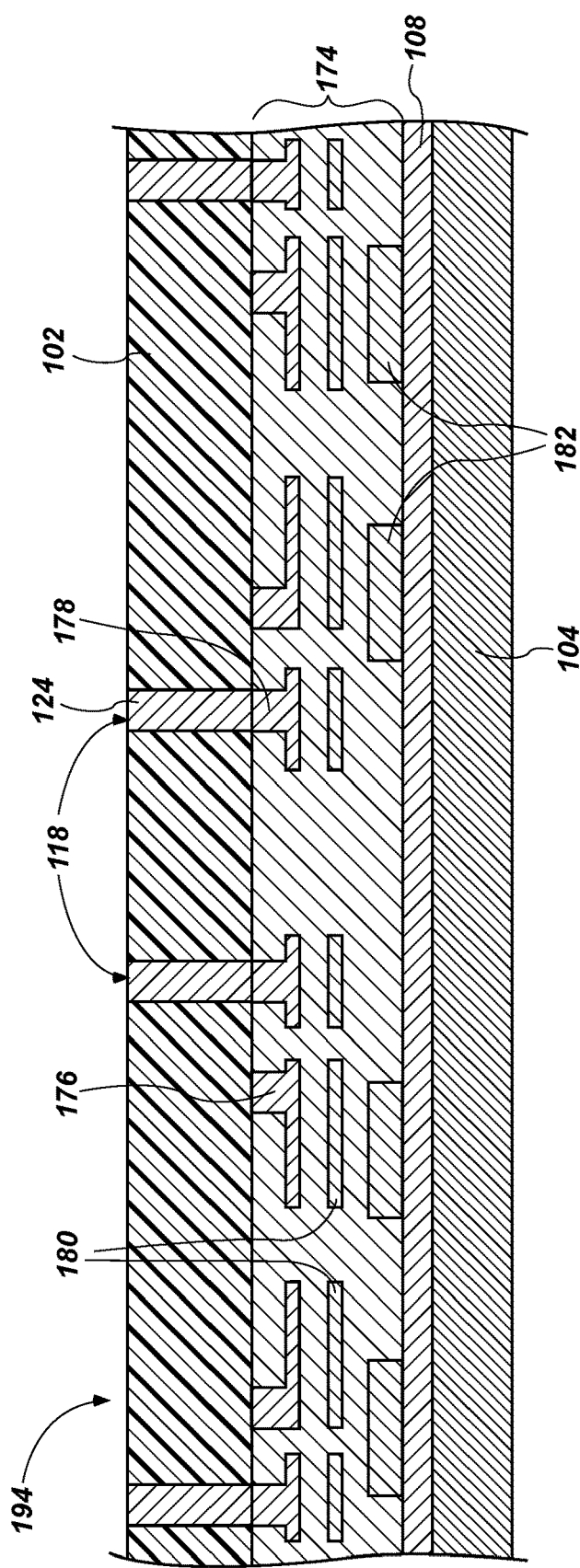
FIG. 15 is a cross-sectional side view of a fourth intermediate product in a fourth stage of the other embodiment of the process of making the semiconductor device module.

FIG. 15 is a cross-sectional side view of a fourth intermediate product 194 in a fourth stage of the other embodiment of the process of making the semiconductor device module 186 (see FIG. 11). During the fourth stage, electrically conductive material 124 may be placed in the holes 118. When the electrically conductive material 124 is placed in the holes 118, the electrically conductive material 124 may be secured to, and form an electrical connection with, the contacts 178 exposed at the bottoms of the holes 118. The electrically conductive material 124 may be placed in the holes 118 by performing any of the actions described previously in connection with FIG. 3, as applied to the positioning and configuration shown in FIG. 15.

Figure 16:
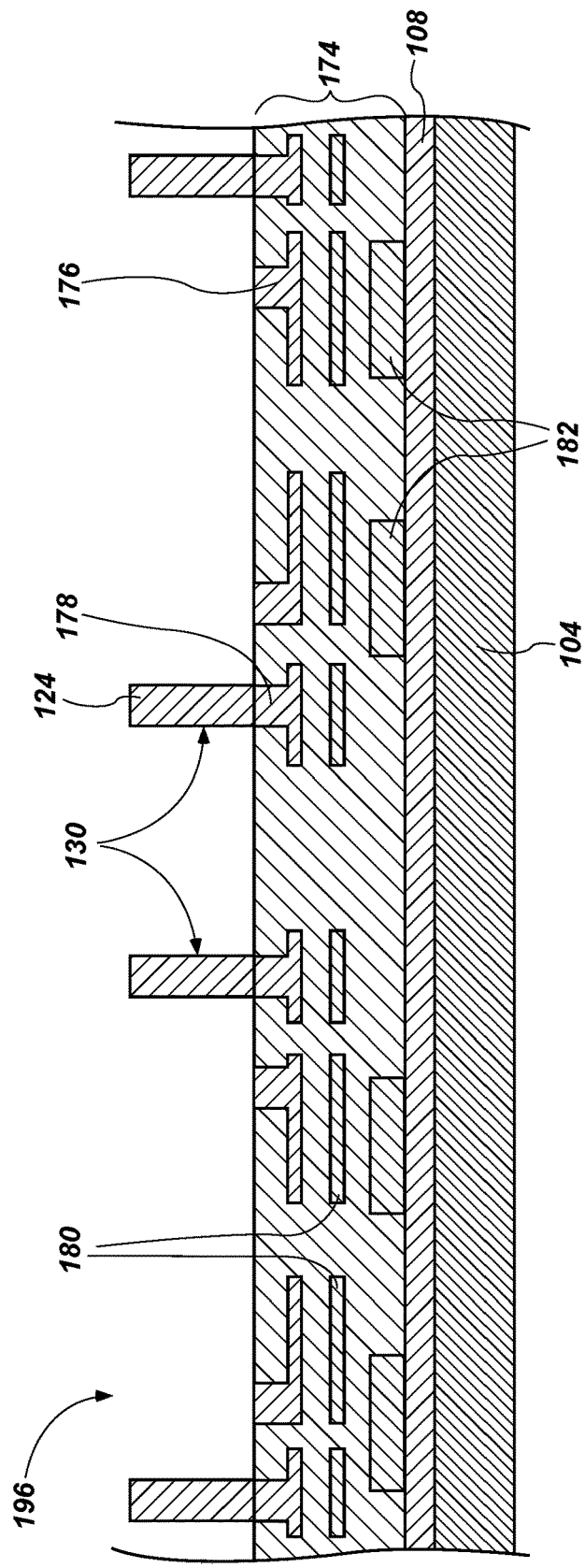
FIG. 16 is a cross-sectional side view of a fifth intermediate product in a fifth stage of the other embodiment of the process of making the semiconductor device module.

FIG. 16 is a cross-sectional side view of a fifth intermediate product 196 in a fifth stage of the other embodiment of the process of making the semiconductor device module 186 (see FIG. 11). During the fifth stage, the sacrificial material 102 may be removed, exposing the posts 130 of the electrically conductive material 124. Removing the sacrificial material 102 may also expose the contacts 176 of the redistribution layer 174 not covered by, and located laterally between sets of, the posts 130. Removal of the sacrificial material 102 may be accomplished by performing any of the actions described previously in connection with FIG. 4, as applied to the configuration shown in FIG. 16.

Figure 17:
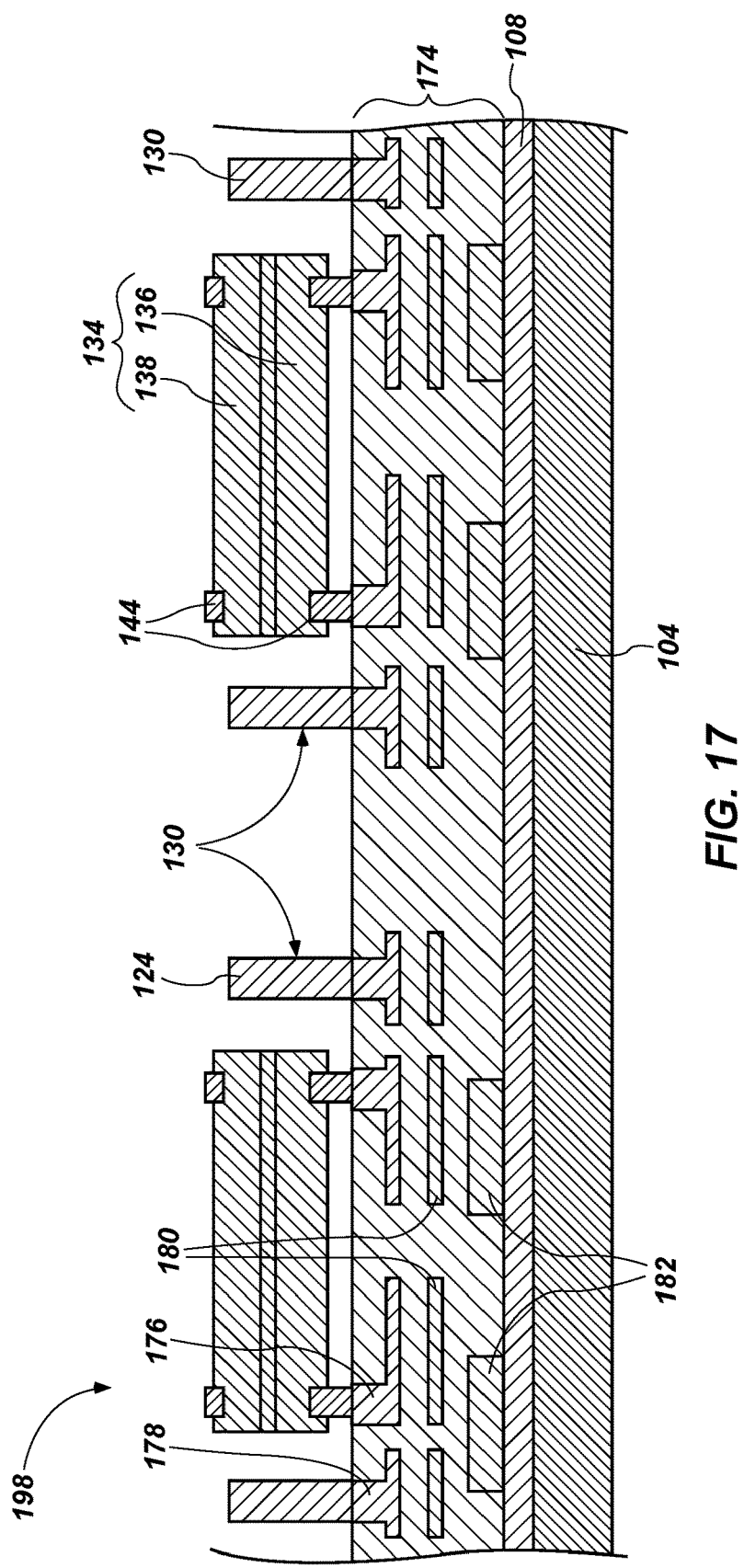
FIG. 17 is a cross-sectional side view of a sixth intermediate product in a sixth stage of the other embodiment of the process of making the semiconductor device module.

FIG. 17 is a cross-sectional side view of a sixth intermediate product 198 in a sixth stage of the other embodiment of the process of making the semiconductor device module 186 (see FIG. 11). During the sixth stage, the stacks 134 of semiconductor dice 136 and 138 may be placed between respective sets of the posts 130 on the contacts 176 of the redistribution layer 174. More specifically, the bond pads 144 of the first semiconductor die 136 of each stack 134 may be aligned with corresponding contacts 176 of the redistribution layer 174, the bond pads 144 and contacts 176 may be brought into contact with one another, and the first semiconductor die 136 may be mechanically and electrically connected to the redistribution layer 174 by securing the bond pads 144 to the contacts 176 (e.g., by introducing a solder material or by flowing an electrically conductive material of the bond pads 144, the contacts 176, or both). Positioning of the stacks 134 relative to the redistribution layer 174 may be accomplished by performing any of the acts described previously in connection with FIG. 5, as applied to the structure and positioning of FIG. 17. By placing the stacks 134 of semiconductor dice 136 and 138 after formation of the redistribution layer 174 (e.g., taking a "chip last" approach), the method may enable testing, assembly, and use of only those stacks 134 known to contain operable semiconductor dice 136 and 138. Moreover, such methodology may reduce the likelihood that electrical connections to the semiconductor dice 136 and 138 experience damage or fail because a greater proportion of the process actions have occurred prior to the introduction of the stack 134.

Figure 18:
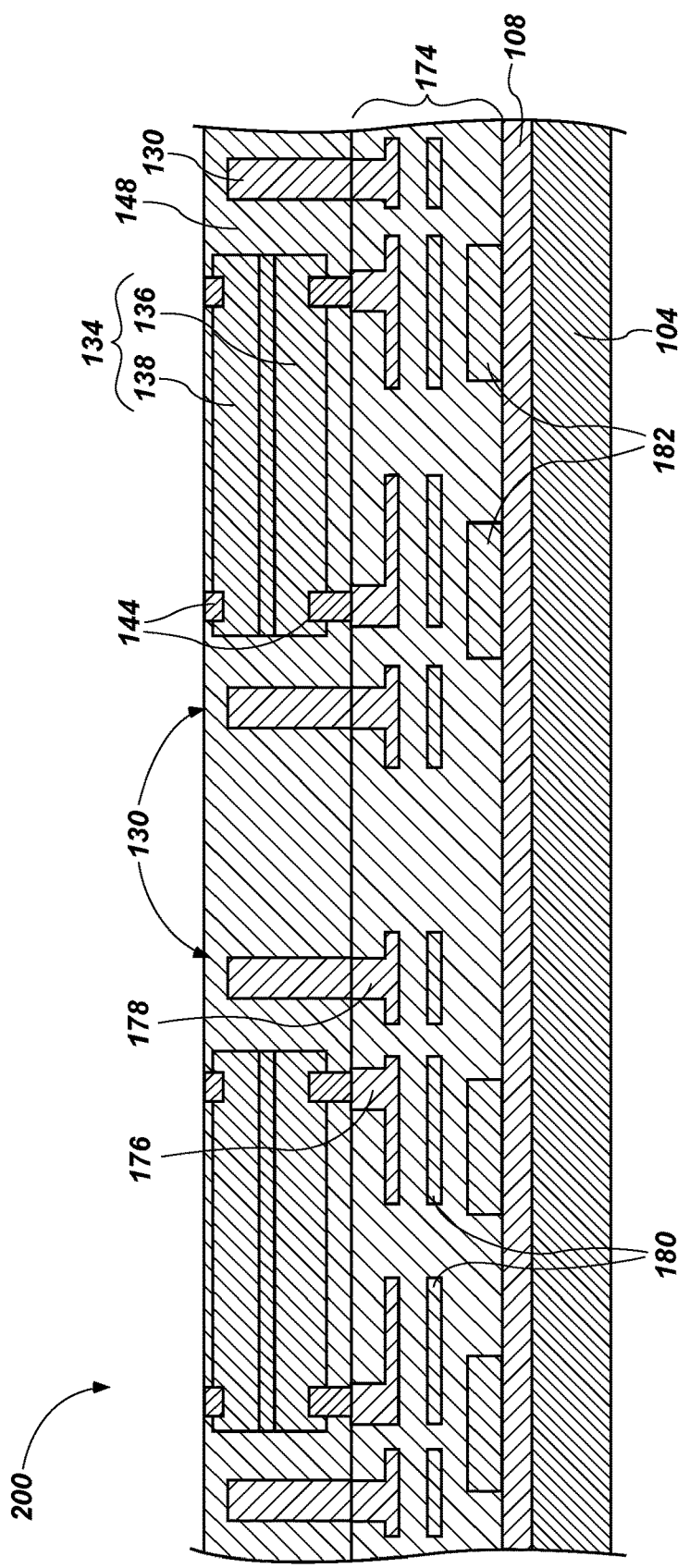
FIG. 18 is a cross-sectional side view of a seventh intermediate product in a seventh stage of the other embodiment of the process of making the semiconductor device module.

FIG. 18 is a cross-sectional side view of a seventh intermediate product 200 in a seventh stage of the other embodiment of the process of making the semiconductor device module 186 (see FIG. 11). During the seventh stage, the stacks 134 of semiconductor dice 136 and 138 and the posts 130 may be at least laterally encapsulated in the encapsulant 148. In addition, a portion of the encapsulant 148 and, optionally, a portion of one or more of the posts 130 and the bond pads 144 of the second semiconductor die 138 may be removed, such as, for example, by grinding to a final thickness. The encapsulating and material removal may be accomplished by performing any of the actions described previously in connection with FIGS. 6 and 7, as applied to the structure of FIG. 18.

Figure 19:
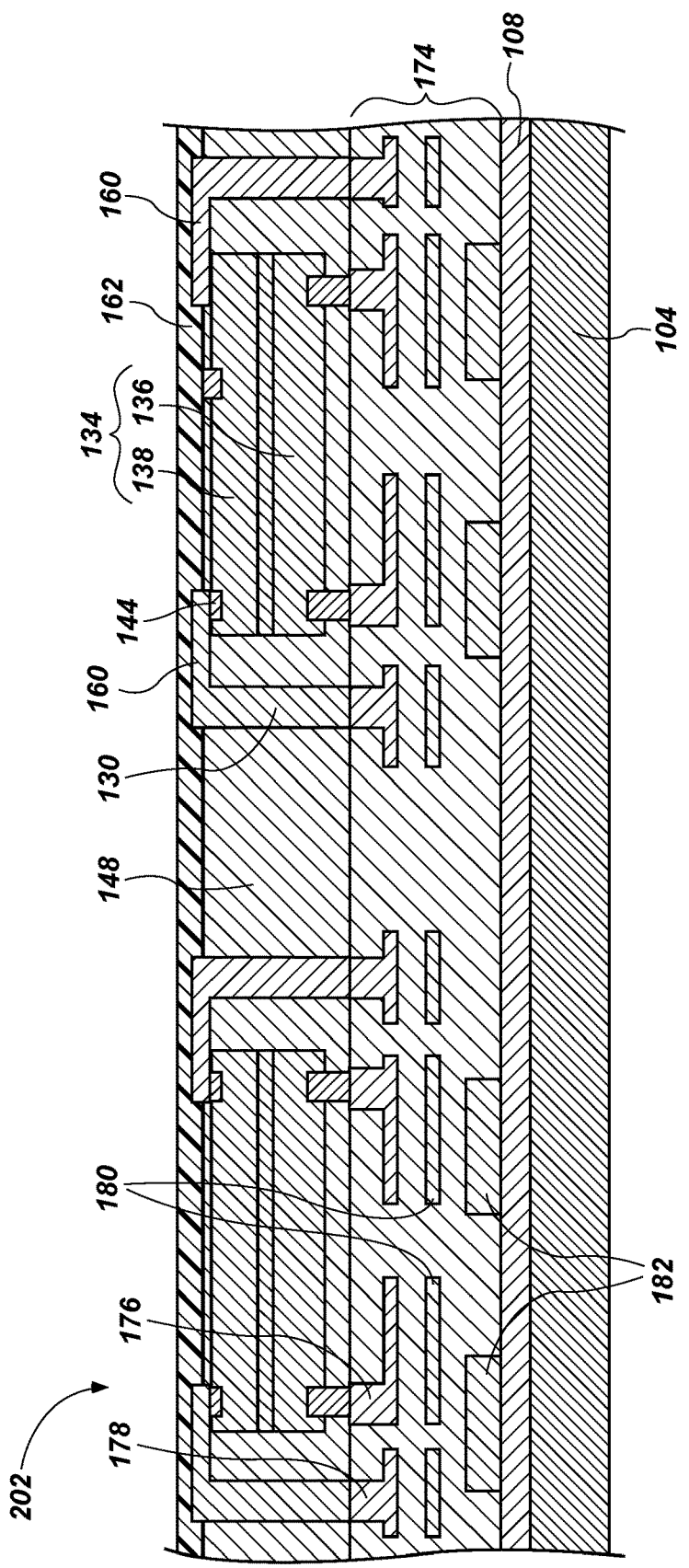
FIG. 19 is a cross-sectional side view of an eighth intermediate product in an eight stage of the other embodiment of the process of making the semiconductor device module.

FIG. 19 is a cross-sectional side view of an eighth intermediate product 202 in an eighth stage of the other embodiment of the process of making the semiconductor device module 186 (see FIG. 11). During the eighth stage, the posts 130 may be electrically connected to the bond pads 144 of the second semiconductor die 138 of a corresponding stack 134 by forming respective electrical connectors 160 extending from given posts 130, over the encapsulant 148, to the bond pads 144. In some embodiments, the electrical connectors 160 may be covered by a protective material 162. The electrical connectors 160 may be placed, and the protective material 162 may be added, by performing any of the actions described previously in connection with FIG. 8, as applied to the structure of FIG. 19.

Figure 20:
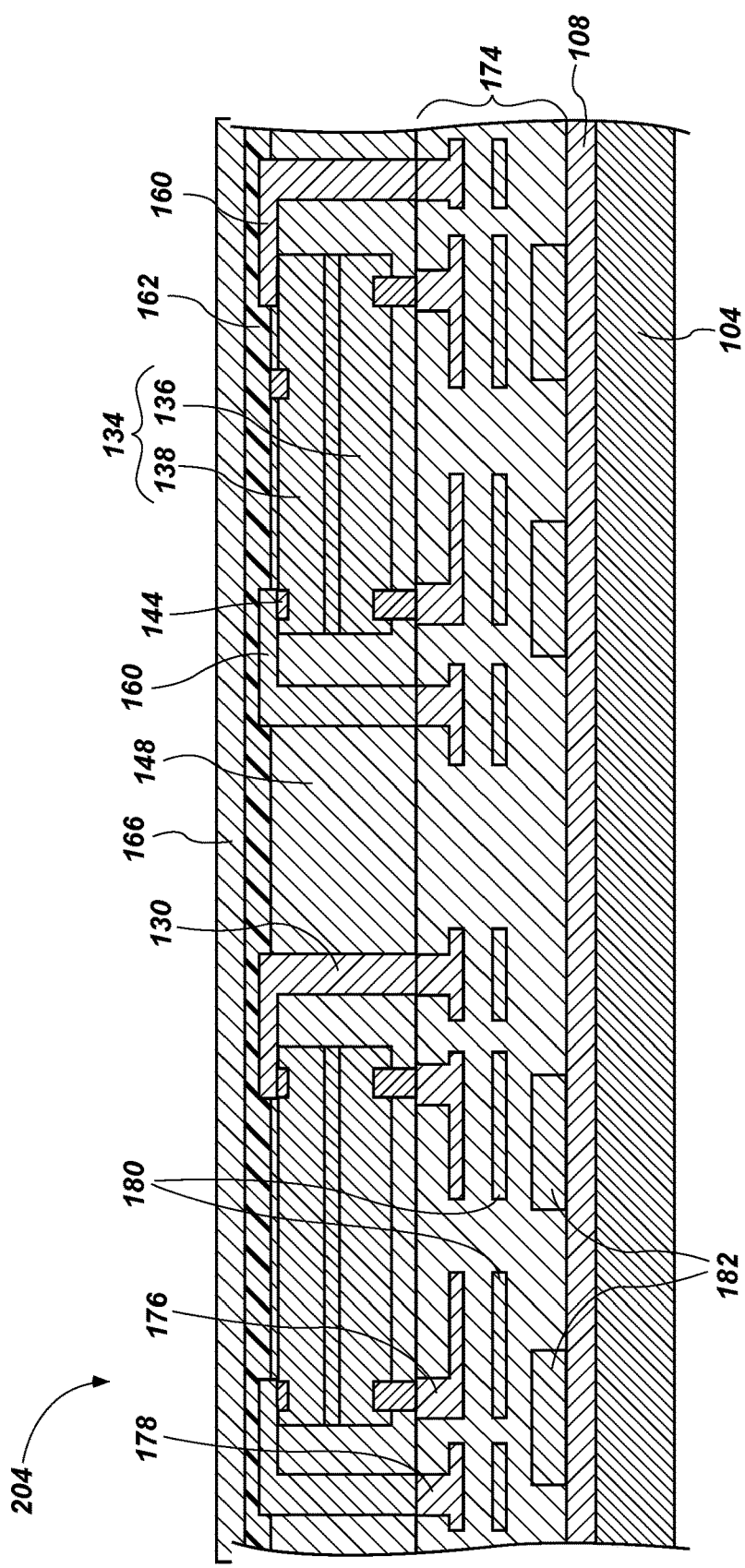
FIG. 20 is a cross-sectional side view of a ninth intermediate product in a ninth stage of the other embodiment of the process of making the semiconductor device module.

FIG. 20 is a cross-sectional side view of a ninth intermediate product 204 in a ninth stage of the other embodiment of the process of making the semiconductor device module 186 (see FIG. 11). During the ninth stage, the other encapsulant 166 may be placed over the optional protective material 162 and over the electrical connectors 160. The other encapsulant 166 may be placed by performing any of the actions described previously in connection with FIG. 9, as applied to the structure of FIG. 20. To form the semiconductor device module 186 (see FIG. 11), the support substrate 104 may be removed by performing any of the actions described previously in connection with FIG. 9, as applied to the structure of FIG. 20, and placing bumps 184 of conductive material on the bond pads 182 of the redistribution layer 174, which may be accomplished by performing any of the actions described previously in connection with FIG. 10, as applied to the structure of FIG. 20.

Figure 21:
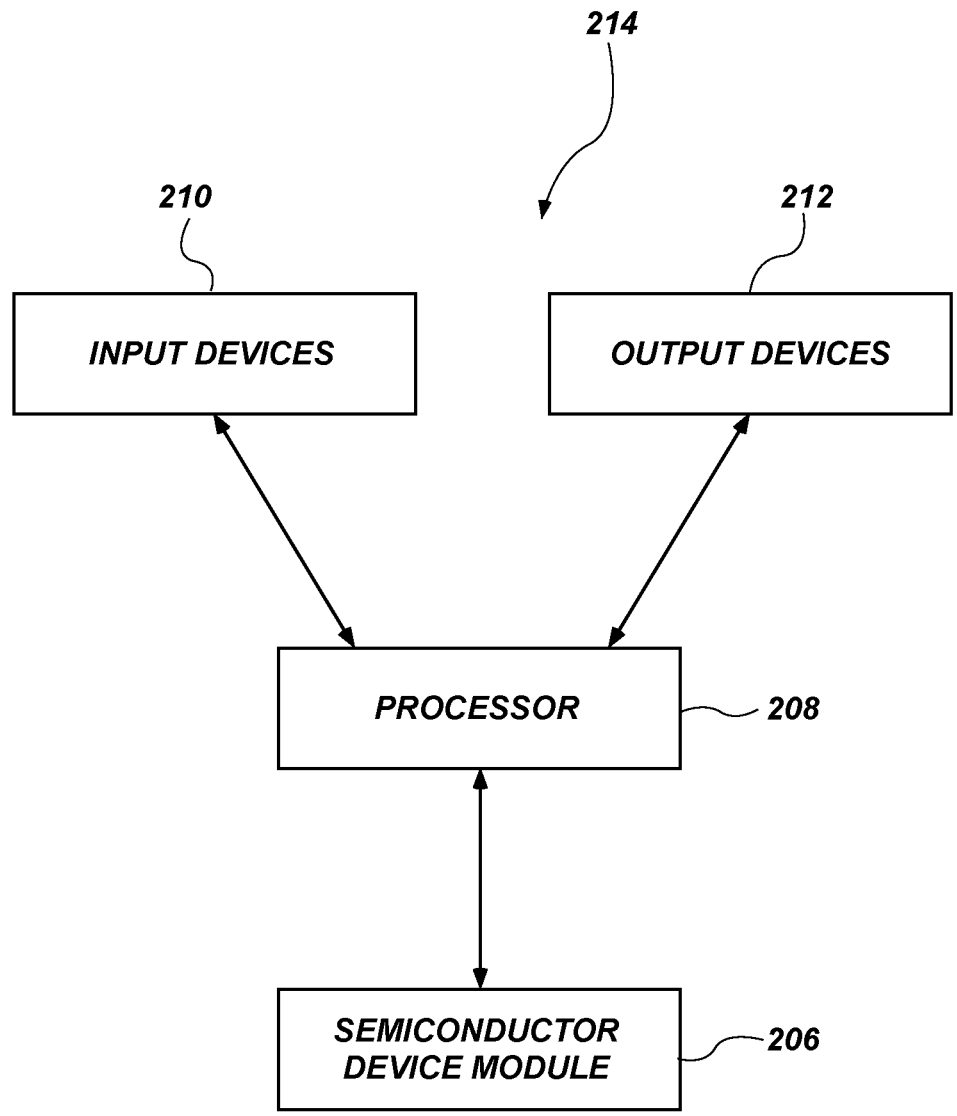
FIG. 21 is a schematic block diagram of a system including a semiconductor device module in accordance with this disclosure.

FIG. 21 is a schematic block diagram of a system 214 including a semiconductor device module 206 in accordance with this disclosure. The system 214 includes a processor 208 electrically coupled with one or more semiconductor device modules 206 (e.g., one or more memory modules), one or more input devices 210, and one or more output devices 212. The system 214 may be a consumer electronic device, such as a desktop computer, a laptop computer, a tablet computer, an electronic reader, a smart phone or other type of communication device, as well as any type of computing system incorporating a semiconductor device module. The semiconductor device module 206 may include a memory device (e.g., one or more of the first and second semiconductor dice 136 and 138), as discussed above.

Semiconductor device modules in accordance with this disclosure may enable better control over the height and width of systems into which they are incorporated. In addition, such semiconductor device modules may reduce process variation. Semiconductor device modules in accordance with this disclosure may further reduce or eliminate the necessity of forming through-silicon-vias and wirebonds to form electrical connections across semiconductor devices. Moreover, the posts described herein may increase throughput and maintain better signal quality that through-silicon-vias and wirebonds. Finally, the modules may enable better quality control through both the processing required to generate them and the ability to test complete modules before they are integrated with a system.

As an illustrative summary, methods of making semiconductor device modules may involve forming holes in a sacrificial material and placing an electrically conductive material in the holes. The sacrificial material may be removed to expose posts of the electrically conductive material. A stack of semiconductor dice may be placed between at least two of the posts after removing the sacrificial material, one of the semiconductor dice of the stack including an active surface facing in a direction opposite a direction in which another active surface of another of the semiconductor dice of the stack. The posts and the stack of semiconductor dice may be at least laterally encapsulated in an encapsulant. Bond pads of the one of the semiconductor dice may be electrically connected to corresponding posts after at least laterally encapsulating the posts and the stack of semiconductor dice.

As another illustrative summary, methods of making semiconductor device modules may involve forming holes in a sacrificial material and forming posts of an electrically conductive material in the holes. The sacrificial material may be removed to expose the posts of the electrically conductive material. Stacks of semiconductor dice may be placed between respective sets of corresponding posts after removing the sacrificial material, each stack comprising two semiconductor dice having active surfaces facing away from one another. The posts and the stacks of semiconductor dice may be at least laterally encapsulated in an encapsulant. Material of at least the encapsulant may be removed to a predetermined thickness. Bond pads of one of the semiconductor dice of each stack may be electrically connected to the corresponding posts of the respective set after removing material of at least the encapsulant to the predetermined thickness.

As yet another illustrative summary, semiconductor device modules may include a redistribution layer and a first semiconductor die located on the redistribution layer, a first active surface of the first semiconductor die facing the redistribution layer. A second semiconductor die may be located on the first semiconductor die, a second active surface of the second semiconductor die facing away from the first semiconductor die. Posts may be located laterally adjacent to the first semiconductor die and the second semiconductor die, the posts extending from the redistribution layer to at least a location coplanar with the second active surface. A first encapsulant may at least laterally surround the first semiconductor die, the second semiconductor die, and the posts. Electrical connectors may extend laterally from the posts, over the first encapsulant, to bond pads on the second active surface of the second semiconductor die. A second encapsulant may be located over the electrical connectors. Conductive bumps may be connected to the redistribution layer on a side of the redistribution layer opposite the first semiconductor die.

As still another illustrative summary, systems may include a processor configured to receive input and generate output and a semiconductor device module operatively connected to the processor. The semiconductor device module may include a first semiconductor die located on the redistribution layer, a first active surface of the first semiconductor die facing the redistribution layer. A second semiconductor die may be located on the first semiconductor die, a second active surface of the second semiconductor die facing away from the first semiconductor die. Posts may be located laterally adjacent to the first semiconductor die and the second semiconductor die, the posts extending from the redistribution layer to at least a location coplanar with the second active surface. A first encapsulant may at least laterally surround the first semiconductor die, the second semiconductor die, and the posts. Electrical connectors may extend laterally from the posts, over the first encapsulant, to bond pads on the second active surface of the second semiconductor die. A second encapsulant may be located over the electrical connectors. Conductive bumps may be connected to the redistribution layer on a side of the redistribution layer opposite the first semiconductor die, the conductive bumps operatively connecting the semiconductor device module to the processor.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of making a semiconductor device module, comprising:
   forming holes in a sacrificial material;
   placing an electrically conductive material in the holes;
   removing the sacrificial material to expose posts of the electrically conductive material;
   placing a stack of semiconductor dice between at least two of the posts after removing the sacrificial material, one of the semiconductor dice of the stack including an active surface facing in a direction opposite a direction in which another active surface of another of the semiconductor dice of the stack;
   at least laterally encapsulating the posts and the stack of semiconductor dice in an encapsulant; and electrically connecting bond pads of the one of the semiconductor dice to corresponding posts after at least laterally encapsulating the posts and the stack of semiconductor dice.

2. The method of claim 1, further comprising placing a redistribution layer in electrical communication with bond pads of the other of the semiconductor dice of the stack after at least laterally encapsulating the posts and the stack of semiconductor dice in the encapsulant.

3. The method of claim 1, wherein placing the stack of semiconductor dice between the corresponding posts after removing the sacrificial material comprises placing the stack of semiconductor dice on a redistribution layer and electrically connecting bond pads of the other of the semiconductor dice of the stack with conductors of the redistribution layer before at least laterally encapsulating the posts and the stack of semiconductor dice in the encapsulant.

4. The method of claim 1, further comprising removing material of at least the encapsulant to expose the bond pads before electrically connecting the bond pads to the corresponding the posts.

5. The method of claim 1, further comprising placing a protective material over electrical connectors extending between the bond pads and the corresponding posts.

6. The method of claim 1, further comprising encapsulating the protective material in another encapsulant.

7. The method of claim 1, further comprising temporarily securing the sacrificial material to a support substrate before forming the holes in the sacrificial material.

8. The method of claim 7, wherein temporarily securing the sacrificial material to the support substrate comprises placing the sacrificial material over an adhesive material comprising a metal or metal alloy material and located on the support substrate.

9. The method of claim 8, wherein placing the electrically conductive material in the holes comprises placing the electrically conductive material in contact with at least the metal or metal alloy material.

10. The method of claim 7, further comprising removing the support substrate after at least laterally encapsulating the posts and the stack of semiconductor dice.

11. The method of claim 1, further comprising temporarily securing the sacrificial material to a redistribution layer before forming the holes in the sacrificial material.

12. The method of claim 11, wherein forming the holes in the sacrificial material comprises exposing electrical conductors of the redistribution layer within the holes and wherein placing the electrically conductive material in the holes comprises electrically connecting the electrically conductive material to the electrical conductors in the holes.

13. The method of claim 12, wherein removing the sacrificial material comprises exposing additional electrical conductors of the redistribution layer and wherein placing the stack of semiconductor dice between the corresponding posts comprises electrically connecting other bond pads of the other of the semiconductor dice of the stack to the additional electrical conductors.

14. The method of claim 11, further comprising removing the support substrate after electrically connecting the bond pads of the one of the semiconductor dice to the corresponding posts.

15. A method of making a semiconductor device module, comprising:
  forming holes in a sacrificial material;
  forming posts of an electrically conductive material in the holes;
  removing the sacrificial material to expose the posts of the electrically conductive material;
  placing stacks of semiconductor dice between respective sets of corresponding posts after removing the sacrificial material, each stack comprising two semiconductor dice having active surfaces facing away from one another;
  at least laterally encapsulating the posts and the stacks of semiconductor dice in an encapsulant;
  removing material of at least the encapsulant to a predetermined thickness; and
  electrically connecting bond pads of one of the semiconductor dice of each stack to the corresponding posts of the respective set after removing material of at least the encapsulant to the predetermined thickness.

16. The method of claim 15, further comprising placing conductors of a redistribution layer in electrical communication with bond pads of the other of the semiconductor dice of at least two of the stacks after at least laterally encapsulating the posts and the stacks of semiconductor dice in the encapsulant.

17. The method of claim 15, wherein placing the stacks of semiconductor dice between the respective sets of the corresponding posts after removing the sacrificial material comprises placing at least two stacks of semiconductor dice on a redistribution layer and electrically connecting bond pads of the other of the semiconductor dice of the at least two of the stacks with the conductors of the redistribution layer before at least laterally encapsulating the posts and the stacks of semiconductor dice in the encapsulant.

18. The method of claim 15, further comprising temporarily securing the sacrificial material to a support substrate before forming the holes in the sacrificial material.

19. The method of claim 15, further comprising temporarily securing the sacrificial material to a redistribution layer before forming the holes in the sacrificial material.

20. The method of claim 19, wherein forming the holes in the sacrificial material comprises exposing electrical conductors of the redistribution layer within the holes and wherein forming posts of the electrically conductive material in the holes comprises electrically connecting the posts to the electrical conductors.

\* \* \* \* \*